United States Patent [19]

Fukuzawa et al.

[11] Patent Number: 4,772,925
[45] Date of Patent: Sep. 20, 1988

[54] HIGH SPEED SWITCHING FIELD EFFECT TRANSISTOR

[75] Inventors: Tadashi Fukuzawa; Ken Yamaguchi; Susumu Takahashi; Hisao Nakashima; Michiharu Nakamura, all of Tokyo, Japan

[73] Assignee: Hitachi, Ltd., Tokyo, Japan

[21] Appl. No.: 935,171

[22] Filed: Nov. 26, 1986

Related U.S. Application Data

[63] Continuation of Ser. No. 648,740, Sep. 10, 1984, abandoned, which is a continuation of Ser. No. 315,059, Oct. 26, 1981, abandoned.

[30] Foreign Application Priority Data

Oct. 31, 1980 [JP] Japan .................... 55-152088

[51] Int. Cl.[4] .................. H01L 29/80; H01L 29/161; H01L 27/12; H01L 29/205
[52] U.S. Cl. ........................................ 357/22; 357/4; 357/16; 357/61
[58] Field of Search ............. 357/22 A, 4, 16, 61

[56] References Cited

U.S. PATENT DOCUMENTS

| | | | |
|---|---|---|---|
| 4,157,556 | 6/1979 | Decker et al. | 357/16 |
| 4,195,935 | 3/1980 | Dingle et al. | 357/16 |
| 4,424,525 | 1/1984 | Mimura | 357/22 |

OTHER PUBLICATIONS

J. Barnard et al, "Double Heterostructure $Ga_{0.47}In_{0.53}$ MESFETs with Submicron Gates", *IEEE Electron Dev. Letters*, vol. EDL-1 (1980), pp. 174–176.

V. Mimura et al., "A New Field-Effect Transistor with Selectively Doped GaAs/a-Al,CA, hd $xGa_{1-}As$ Heterojunctions, Japanese Journal of Applied Physics, vol. 19 (1980), pp. L225–L227.

*Primary Examiner*—J. Carroll
*Attorney, Agent, or Firm*—Antonelli, Terry & Wands

[57] ABSTRACT

The semiconductor device of this invention consists at least of a laminate of a semi-insulating or p-type first semiconductor layer having a forbidden band width $E_{g1}$, an undoped or p-type second semiconductor layer having a forbidden band with $E_{g2}$ and an n-type third semiconductor layer having forbidden band width $E_{g3}$. The laminate is deposited on a predetermined semiconductor substrate and the forbidden band width has the relation $E_{g2} < E_{g1}$, $E_{g3}$. A pair of electrodes are so formed as to come into contact at least with the interface between the second and third semiconductor layers, and a control electrode, which forms a Schottky junction with the third semiconductor layer, is formed at a predetermined position interposed between the pair of electrodes. The semiconductor device has excellent pinch-off characteristic.

5 Claims, 6 Drawing Sheets

HIGH SPEED SWITCHING FIELD EFFECT TRANSISTOR

This is a continuation application of Ser. No. 648,740, filed Sept. 10, 1984 abandoned, which is a continuation application of U.S. Ser. No. 315,059, filed Oct. 26, 1981 abandoned.

BACKGROUND OF THE INVENTION

1. Field of the Invention

The invention relates to a field effect transistor (hereinafter referred to as an "FET") having excellent high speed switching performance. An element integrating these FETs is suitable, for example, as a logical element of a ultrahigh speed computer.

2. Description of the Prior Art

The technical concept of the element of this invention is based upon the fact that the electron mobility (66) can be enhanced by reducing ionized-impurity scattering, that is, scattering that is applied to the electrons inside a semiconductor, and lattice scattering. First, the ionized-impurity scattering can be reduced while maintaining a sufficient electron density by isolating a layer, which is to be doped with an impurity as an electron donor, from a layer which permits the electrons to travel, in accordance with a selective doping method. Second, lattice scattering can be reduced by cooling the element. If GaAs is used as the channel for permitting the electrons to travel, the electron mobility of $\mu \approx 40,000 \, cm^2V^{-1}S^{-1}$ is observed in undoped GaAs which is cooled down to 77° K. after selective doping, whereas electron mobility is $\mu = 3,000 \, cm^2V^{-1}S^{-1}$ (300° K.) in n-GaAs which contains the electron donor by itself ($n \approx 1 \times 10^{18}$ ion/$cm^3$). High speed switching elements utilizing this large electron mobility have heretofore been proposed, as exemplified by T. Mimura et al. "Japanese Journal of Applied Physics", Vol. 19, L 225, 1980.

FIG. 1 is a sectional view of a semiconductor device on which the present invention is based. In the drawing, reference numeral 1 denotes a GaAs semi-insulating substrate; 2 is a GaAs layer that does not contain an impurity such as an electron donor; 4 is a $Ga_{0.7}Al_{0.3}As$ to which an n-type impurity is doped ($n = 2 \times 10^{18}$ ion/$cm^3$); and 5, 6 and 7 are source, gate and drain electrodes, respectively.

Reference numeral 3 denotes electrons that are fed from the n-$Ga_{0.7}Al_{0.3}As$ layer 2. The current flowing through the source and drain relies upon this electron movement.

FIG. 2 shows the potential distribution of the conduction band at the interface between the layer 2 and the layer 4. A spike-like carrier profile 12 of the conduction band 11 is shown occurring due to the heterojunction. The electrons are accumulated at the portions below the Fermi level and contribute to conduction.

SUMMARY OF THE INVENTION

The semiconductor device in accordance with the present invention includes at least a narrow bandgap semiconductor layer and first and second wide bandgap semiconductor layers where two interfaces between the narrow bandgap semiconductor layer and the first and second wide bandgap semiconductor layers form heterojunctions, respectively; the narrow bandgap semiconductor layer is a layer not substantially containing any impurity; the wide bandgap semiconductor layers each are layers for feeding a carrier into the narrow bandgap semiconductor layer; a pair of electrodes are disposed on the heterojunctions between the second wide bandgap semiconductor layer and the narrow bandgap semiconductor layer; and an electrode for controlling the carrier is disposed at a predetermined position on the second wide bandgap semiconductor layer interposed between the pair of electrodes.

DETAILED DESCRIPTION OF THE INVENTION

Figure 3A:
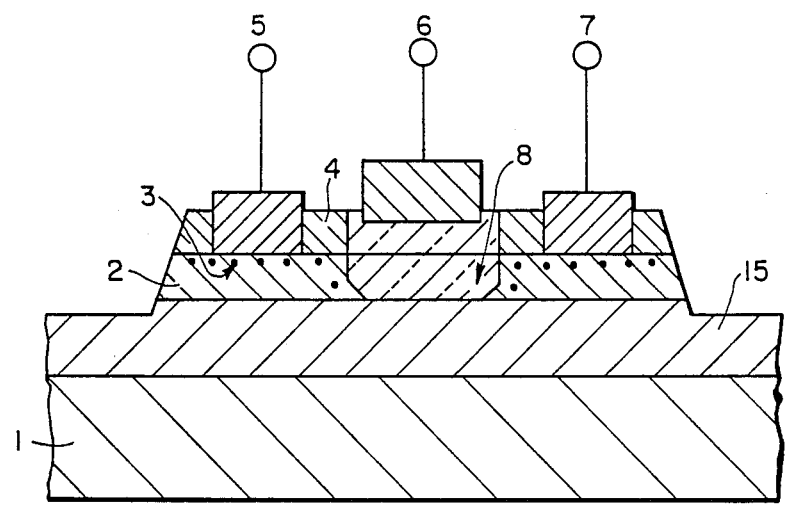
FIGS. 3A and 3B are sectional views of the principal portions of different embodiments of high speed FETs in accordance with the present invention.
Figure 3B:
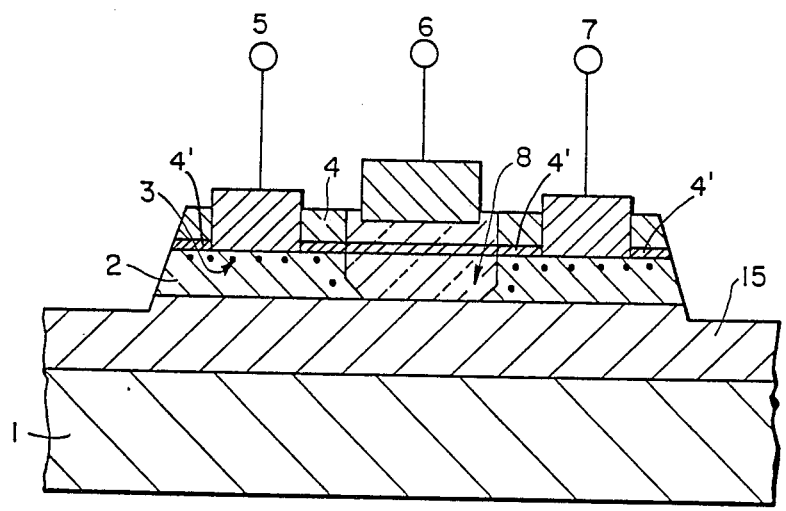

FIGS. 3A and 3B are sectional views of different embodiments of the transistor of the present invention.

Reference numeral 1 denotes a semiconductor substrate. Though a semi-insulating material is generally used for the semi-conductor substrate, the substrate need not always be a semi-insulating material if a first semiconductor layer 15 is made of a semi-insulating material. This first semiconductor layer 15 (forbidden band width $E_{g1}$) is so selected as to form a heterojunction together with a second semiconductor layer 2 that is to be formed thereon. To take an example of GaAs-GaAlAs type materials, p type or semi-insulating GaAlAs is used for the first semiconductor layer. The thickness of this layer is so selected as not to generate the tunnel effect. It is at least 200 Å for the practical application. If the thickness is too great, crystal defects would occur. Hence, it is generally about 1 $\mu m$.

The second semiconductor layer 2 (forbidden band width $E_{g2}$) is formed on the first semiconductor layer 15. This layer operates in the same way as the semiconductor layer 2 of the conventional element depicted in FIG. 1. To take an example of GaAs-GaAlAs type materials, it is a non-doped or $p^-$-type layer. The second semiconductor layer has a relatively smaller impurity concentration than the first semiconductor layer.

A third semiconductor layer 4 (forbidden band width $E_{g3}$) is formed on the second semiconductor layer 2. This layer 4 is of an n type. Incidentally, the forbidden band width of each of these semiconductor layers 15, 2 and 4 is so selected as to satisfy the relation $E_{g2} < E_{g1}$, $E_{g3}$.

Figure 1:
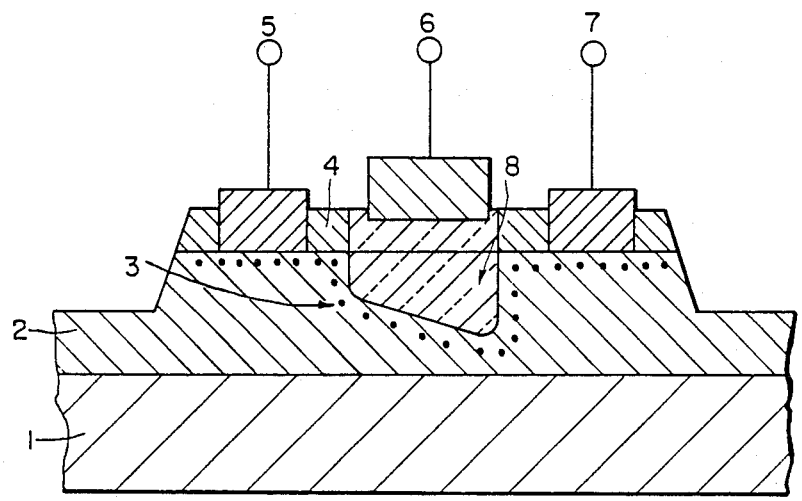
FIG. 1 is a sectional view of the principal portions of a conventional high speed FET.
Figure 2:
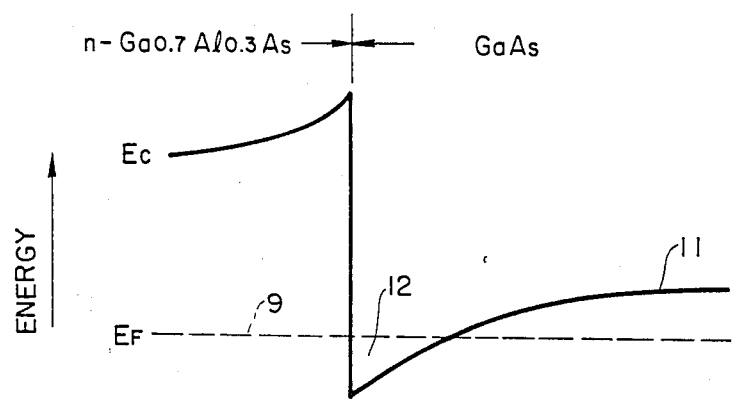
FIG. 2 is a schematic energy band diagram of a non-doped GaAs/N-GaAlAs heterojunction.

Reference numerals 5, 6 and 7 in FIGS. 3A and 3B denote source, gate and drain electrodes, respectively, in the same way as in FIG. 1. Reference numeral 8 denotes a depletion layer when a negative voltage is impressed upon the gate electrode 6, in the same way as in FIG. 1.

As impurities in the GaAs and GaAlAs types, at least one member of the group consisting of Si, Sn, Te and Ge (when As-rich) is generally selected as the donor and at least one member of the group consisting of Be, Mg, Mn and Ge (when Ga-rich) is generally selected as the acceptor.

Figure 4:
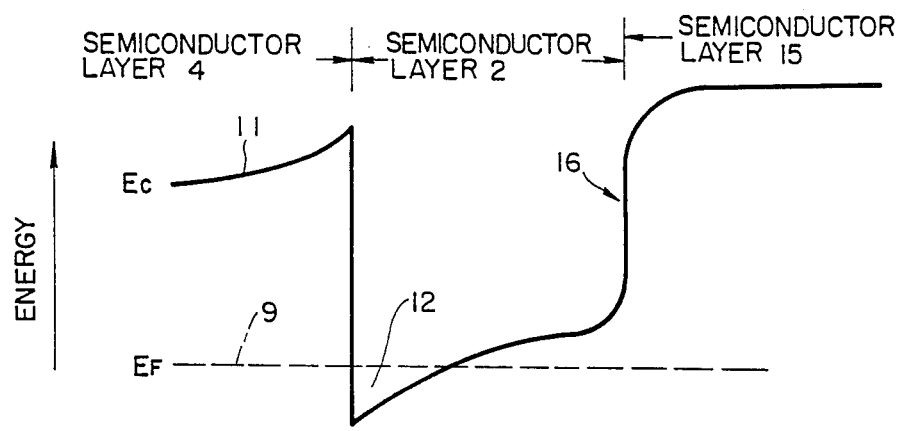
FIG. 4 is a schematic energy band diagram of a double-heterojunction.

The element of the present invention is differentiated from the conventional element in that that the semi-insulating or p⁻-type first semiconductor layer 15 is interposed between the semi-insulating substrate 1 and the p⁻-GaAs layer 2. FIG. 4 illustrates the band structure of the element of this invention. This structure can be realized by use of p⁻-$Ga_{0.7}Al_{0.3}As$ as the first semiconductor layer 15, p⁻-GaAs as the second semiconductor layer and n-$Ga_{0.7}Al_{0.3}As$ as the third semiconductor layer 4, for example.

A potential barrier 16 can be formed in the conduction band by coupling the p⁻-$Ga_{0.7}Al_{0.3}As$ layer 15 to the p⁻-GaAs layer 2 and even when the gate voltage is applied, electrons do not move from the p⁻-GaAs layer to the substrate. With reference to FIGS. 3A and 3B, the electrons do not migrate to the semiconductor layer 15 on the substrate side. The layer 15 has an arbitrary thickness and can be used as a buffer layer in growing the layer 2 by the molecular beam epitaxial process. According to this structure, the current flow does not lower even when the p⁻-GaAs layer 2 has a sufficiently large thickness and hence, an element having excellent pinch-off characteristic can be obtained.

The operation of the conventional semiconductor device will be compared with that of the device of the present invention to clarify the differences between them.

As described already, in the semiconductor device shown in FIG. 1, the influences of the impurity scattering and lattice scattering do not exist so that the electron mobility ($\mu$) is great. High speed current switching can be effected by applying a negative voltage to the gate 6 to restrict the flow of electrons through the gate. as two-dimensional conduction. As shown in FIG. 1, when the negative voltage is applied to the gate, the depletion layer 8 passes through the $Ga_{0.7}Al_{0.3}As$ layer 4 and extends up to the GaAs layer 2, whereby the electrons 3 are pushed down to the substrate.

Figure 5:
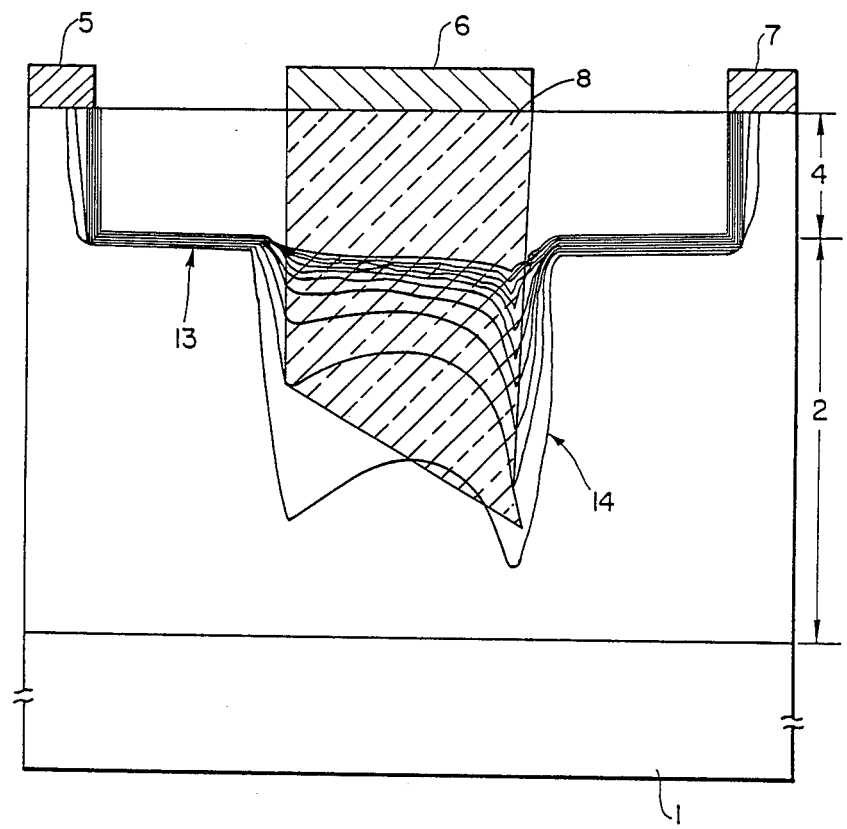
FIG. 5 is a sectional view as a model of the current path of the high speed FET shown in FIG. 1.

The current paths at this time are diagrammatically shown in FIG. 5. The gate impressed voltage is -0.4V. The current path 14 inside the GaAs layer 2 is expressed by dividing all current into ten equal parts. In such a region where no gate exists, the current flows through an extremely narrow region 13 along a spike-like potential profile at the interface between the $Ga_{0.7}Al_{0.3}As$ layer and the GaAs layer. But in the region in which the depletion layer extends due to the gate voltage into the substrate, the current path expands towards the substrate. It can thus be appreciated that restriction of the current is not good.

Figure 6:
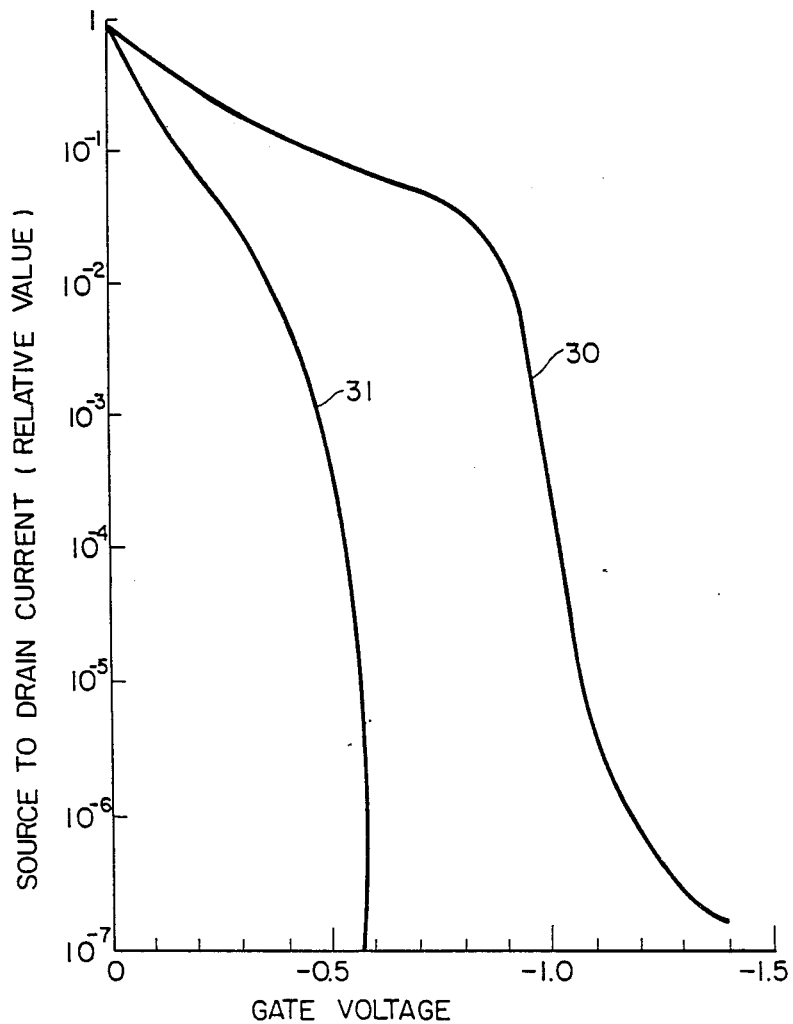
FIG. 6 is a diagram showing a gate voltage vs. source-to-drain current characteristic.

The relation between the drain-to-source current $I_{DS}$ and the gate impressed voltage $V_g$ of the element fabricated is represented by a curve 30 in FIG. 6. The current can not be restricted by increasing the gate voltage. This becomes a critical problem when a logic circuit is formed. The current leakage from above −1.2V results from the fact that due to deflection of the current path to the semi-insulating substrate, pinchoff is not effectively attained.

One of the conceivable methods of effectively effecting pinch-off is to reduce the thickness of the undoped GaAs layer down to several hundreds of angstroms (Å). However, this method is not preferable for the following three reasons.

(1) Total current quantity decreases as the electrons in the GaAs layer enter the semi-insulating substrate.
(2) The method is susceptible to influences from the properties of the semi-insulating substrate, especially to that of the electron mobility.
(3) An approximate 100 Å thick active layer must be formed immediately above the substrate and this is difficult from the aspect of the crystal growth.

The present invention solves these problems by providing a layer which forms the electron channel with a double heretojunction.

Though the foregoing description deals with the GaAs and $Ga_{1-x}Al_xAs$ type double hetero structure elements, the present invention makes it possible to obtain exactly the same effect from other semiconductor materials having the double hetero structure (e.g. semiconductor materials of the compound of elements of the Groups III-V). Definite examples include $Ga_{1-x}Al_xAs$—$Ga_{1-y}Al_yAs$, $x \neq y$,
GaAs-AlGaAsP, InP-InGaAsP, InP-InGaAs, InAs-GaAsSb, and the like.

Preferred embodiments of the present invention will be described in detail with reference to FIGS. 3A and 3B.

A semi-insulating GaAs substrate 1 is prepared and is baked in vacuum at a temperature of 500° C. or above to remove oxides on the surface therefrom. Next, a clean surface on the (100) plane of the GaAs substrate 1 is exposed by an ion sputtering method using an inert gas such as argon, for example. The substrate is placed in a molecular beam growing apparatus and exhaust is made to vacuum of about $10^{-11}$ Torr. Using GaAs and Al as the vapor deposition source, a $Ga_{0.7}Al_{0.3}As$ crystal layer 15 is allowed to grow on the abovementioned GaAs substrate. The substrate temperature of generally 400 to 620° C. is employed during growth by the molecular beam epitaxial method. The layer 15 is generally 0.5 to 1.0 $\mu$m thick. In this case, the impurity concentration is approximately $N_A \approx 10^{14}$ to $10^{15}cm^{-3}$ to obtain weak p-type semiconductivity.

Next, only GaAs is evaporated to grow a weak p-type GaAs layer 2 having an impurity concentration $N_A \approx 10^{14}$ to $10^{15}cm^{-3}$. (The layer may naturally be undoped.) The layer 2 is generally 0.05 to 0.3 $\mu$m thick. In the embodiment of FIG. 3B, using Al and GaAs as the vacuum deposition source, an undoped $Ga_{0.7}Al_{0.3}As$ layer 4' is allowed to grow in a thickness of about 0.005 $\mu$m on the layer 2. Furthermore, using Si, Al and GaAs as the vacuum deposition source, a 0.02 $\mu$m thick n-type ($N \approx 2 \times 10^{18}cm^{-3}$) $Ga_{0.7}Al_{0.3}As$ layer 4 is allowed to grow on the first $Ga_{0.7}Al_{0.3}As$ layer 4' of FIG. 3B, which is an insertion layer for improving the surface condition.

In the embodiment of FIG. 3A there is no layer corresponding to the insertion layer 4' of FIG. 3B.

Though not always necessary, this insertion layer 4' is aligned with both boundary surfaces with the lattice alignment and does not substantially contain any impurity. It is generally about 10 to 60 Å thick.

As shown in FIGS. 3A and 3B, an electrode may theoretically be formed directly on this layer 4 but from the practical viewpoint, a thin n⁻-GaAs layer is mostly formed on the layer 4. The thin layer prevents oxidation of the n-$Ga_{0.7}Al_{0.3}As$ layer 4. In this embodiment, Si is doped to attain an impurity concentration $N \approx 2 \times 10^{16}cm^{-3}$ and thickness of about 0.1 $\mu$m. Since this layer is dispsoed simply to prevent oxidation, it is preferred that the thickness and impurity concentration are not great.

Next, in the same way as in the ordinary GaAs type FETs, ohmic electrodes are formed by Au-Ge-Ni alloy as the source and drain electrodes 5 and 7 while an electrode using a laminate structure of Cr, Mo and Au is formed as the gate electrode 6. The electrode forms a Schottky junction together with the semiconductor material.

A great number of FET elements can be isolated from one another by removing the semiconductor layer 2 by mesa etching.

In this structure, an FET having 1 $\mu$m long gate and 10 $\mu$m wide gate is fabricated. This FET enables modulation of 20 GHz in liquid nitrogen. When the FETs are assembled as an IC, the same characteristic can be obtained.

Curve 31 is FIG. 6 represents dependency of the source-to-drain current upon the gate impressed voltage. It can be appreciated that the FET in accordance with the present invention exhibits extremely effective pinch-off in comparison with the characteristic represented by the curve 30. This diagram is plotted at the element temperature of 77° K.

As described already, the present invention can be applied to materials other than the GaAs-GaAlAs type. The following will explain an embodiment using a semiinsulating InP substrate by way of example.

The basic structure is the same as that shown in FIG. 5.

A 300 Å thick n-type $In_{0.52}Al_{0.48}As$ layer 15, a 0.1 $\mu$m thick undoped $In_{0.53}Ga_{0.47}As$ layer 2 and 0.5 $\mu$m thick $p^-$-type $In_{0.52}Al_{0.48}As$ layer 4 are allowed to grow on the semi-insulating InP substrate 1. Al is used for the gate electrode 6 while Au-Ge-Ni alloy is used for the source and drain electrodes 5 and 7. In this structure, too, the effective pinch-off can be obtained in the same way as the GaAs-GaAlAs type FET.

The basic technical concept of the present invention can naturally be modified in various manners.

Next, an application example for increasing the current will be described.

Figure 7:
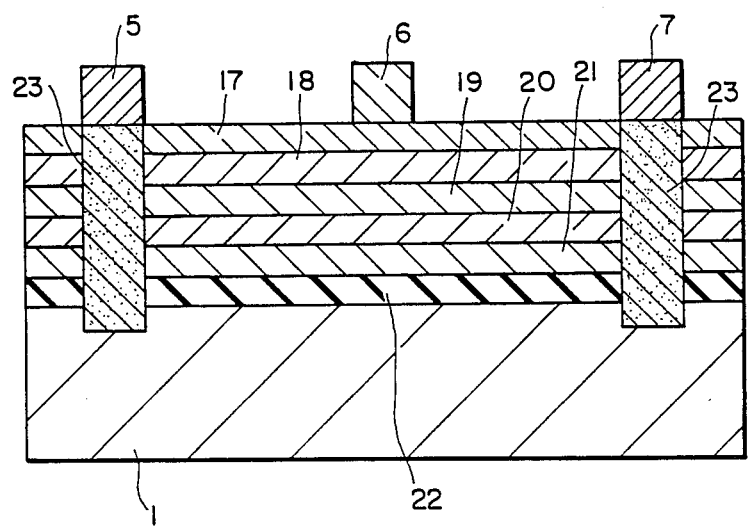
FIG. 7 is a sectional view of the principal portions of another embodiment of the present invention.

FIG. 7 is a sectional view of an element having excellent pinch-off characteristic which increases the element current without increasing its size. In the drawing, reference numerals 5, 6 and 7 represent the source, gate and drain electrodes, respectively. Reference numeral 23 represents an $n^+$ implantation region to the semiconductor layer to establish ohmic contact. The $n^+$ implantation region reaches the semi-insulating GaAs substrate 1. Reference numerals 17, 19 and 21 represent GaAs that are not doped with an impurity and has high electron mobility at low temperature. Conduction regions are formed in the proximity of each heterojunction surface of each of these layers. Reference numerals 18 and 20 represent $n$-$Ga_{0.7}Al_{0.3}As$ layers that feed the electrons to the undoped GaAs layers.

When a positive pulse is fed to the gate as a normally-off type gate, four layers in total exists in this structure that generate two-dimensional conduction. Hence, by effecting n type doping of $2 \times 10^{18}$ ion/cm$^3$ to the layers 18 and 20, a current value of about three times greater tham that of single layer could be obtained. The semiconductor layer 22 is a $Ga_{0.7}Al_{0.3}As$ layer for improving the cut-off characteristic of the FET and has either the semi-insulating property or p-type ($p^-$) conductivity close to the insulating property. This layer forms the potential barrier similar to that 16 shown in FIG. 6 and is capable of preventing leakage of the carrier.

What is claimed is:

1. A semiconductor device comprising:
    a semiconductor substrate;
    a first wide bandgap semiconductor layer disposed on the substrate, said first wide bandgap semiconductor layer being semi-insulating or having p-type or $p^-$-type conductivity, and a second wide bandgap semiconductor layer, said second wide bandgap semiconductor layer having a n-type conductivity;
    a narrow bandgap semiconductor layer interposed between said wide bandgap semiconductor layers and forming heterojunctions therewith, said narrow bandgap semiconductor layer being undoped or having a $p^-$-type conductivity and having a smaller impurity concentration than the first bandgap semiconductor layer, and the heterojunction between the narrow bandgap semiconductor layer and the second wide bandgap semiconductor layer having a spike-like potential profile;
    first and second electrodes disposed in contact with said heterojunction between said second wide bandgap semiconductor layer and said narrow bandgap semiconductor layer;
    a third electrode for controlling the flow of carriers through said narrow bandgap layer, said third electrode disposed in contact with said second wide bandgap semiconductor layer and interposed between said first and second electrodes; and
    said wide bandgap semiconductor layers functioning as layers for feeding carriers into said narrow bandgap semiconductor layer.

2. The semiconductor device as defined in claim 1, further comprising a wide bandgap semiconductor layer containing substantially no impurities disposed at the interface between said second wide bandgap semiconductor layer and said narrow bandgap semiconductor layer, which further wide bandgap semiconductor layer forms a heterojunction together with said narrow bandgap semiconductor layer.

3. The semiconductor device as defined in claim 1 or 2, wherein said wide bandgap semiconductor layers are GaAlAs and said narrow bandgap semiconductor layer is GaAs.

4. A semiconductor device comprising:
    a semiconductor substrate;
    a multilayer structure disposed on said substrate; said multilayer structure having a plurality of narrow bandgap semiconductor layers containing substantially no impurities and a plurality of wide bandgap semiconductor layers of n-type conductivity, said narrow and wide bandgap layers being formed alternatively on each other to form a plurality of heterojunctions, and the heterojunctions between narrow bandgap semiconductor layers and the plurality of wide bandgap semiconductor layers of n-type conductivity having a spike-like potential profile;
    first and second electrodes disposed on implantation regions extending through said multilayer structure into electrical contact with said substrate and electrical contact with said plurality of heterojunctions;
    a third electrode for controlling the flow of carriers through said narrow bandgap semiconductor layers, said third electrode being disposed between said first and second electrodes and in contact with one of said narrow bandgap semiconductor layers; and wherein a potential barrier layer is disposed between said multilayer structure and said substrate, said barrier layer being semi-insulating, or a p-type or $p^-$-type conductivity.

5. The semiconductor device as defined in claim 4, wherein said implantation regions are of a $n^+$-type conductivity.

* * * * *